(12) United States Patent
Hong et al.

(10) Patent No.: US 10,790,186 B2
(45) Date of Patent: Sep. 29, 2020

(54) SEMICONDUCTOR DEVICE INCLUDING A PASSIVATION SPACER AND METHOD OF FABRICATING THE SAME

(71) Applicant: SAMSUNG ELECTRONICS CO., LTD., Suwon-si, Gyeonggi-do (KR)

(72) Inventors: Jiseok Hong, Yongin-si (KR); Chan-Sic Yoon, Anyang-si (KR); Ilyoung Moon, Yongin-si (KR); Jemin Park, Suwon-si (KR); Kiseok Lee, Hwaseong-si (KR); Jung-Hoon Han, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 1 day.

(21) Appl. No.: 15/984,524

(22) Filed: May 21, 2018

(65) Prior Publication Data

US 2019/0122919 A1    Apr. 25, 2019

(30) Foreign Application Priority Data

Oct. 20, 2017    (KR) .......................... 10-2017-0136295

(51) Int. Cl.
| | | |
|---|---|---|
| *H01L 21/768* | (2006.01) | |
| *H01L 23/532* | (2006.01) | |
| *H01L 23/522* | (2006.01) | |

(52) U.S. Cl.
CPC .. *H01L 21/76802* (2013.01); *H01L 21/76804* (2013.01); *H01L 21/76814* (2013.01); *H01L 21/76816* (2013.01); *H01L 21/76831* (2013.01); *H01L 21/76879* (2013.01);
(Continued)

(58) Field of Classification Search
CPC ......... H01L 21/76802; H01L 21/76804; H01L 21/76813; H01L 21/76814; H01L 21/76816; H01L 21/76831
See application file for complete search history.

(56) References Cited

U.S. PATENT DOCUMENTS

| | | | | |
|---|---|---|---|---|
| 6,165,839 A | * | 12/2000 | Lee .................. | H01L 27/10888 257/E21.019 |
| 7,135,744 B2 | * | 11/2006 | Kim ................. | H01L 21/76831 257/365 |
| 7,691,736 B2 | | 4/2010 | Beck et al. | |

(Continued)

FOREIGN PATENT DOCUMENTS

| | | |
|---|---|---|
| KR | 10-1138075 | 4/2012 |
| KR | 10-1546995 | 8/2015 |

(Continued)

*Primary Examiner* — Matthew E Warren
(74) *Attorney, Agent, or Firm* — F. Chau & Associates, LLC

(57) ABSTRACT

A method of fabricating a semiconductor device includes providing a substrate, and forming an interlayered insulating layer on the substrate. The method includes forming a preliminary via hole in the interlayered insulating layer. The method includes forming a passivation spacer on an inner side surface of the preliminary via hole. The method includes forming a via hole using the passivation spacer as an etch mask. The method includes forming a conductive via in the via hole. The passivation spacer includes an insulating material different from an insulating material included in the interlayered insulating layer.

14 Claims, 13 Drawing Sheets

(52) U.S. Cl.
CPC .... *H01L 21/76883* (2013.01); *H01L 23/5226* (2013.01); *H01L 23/5329* (2013.01)

(56) References Cited

U.S. PATENT DOCUMENTS

| | | |
|---|---|---|
| 8,138,036 B2 | 3/2012 | Andry et al. |
| 8,859,430 B2 | 10/2014 | Chiba |
| 9,355,893 B1 | 5/2016 | Chen et al. |
| 9,659,867 B2 | 5/2017 | Noguchi et al. |
| 9,786,549 B2 | 10/2017 | Singh et al. |
| 2010/0301486 A1* | 12/2010 | Frohberg ............ H01L 21/0337 257/770 |
| 2011/0291292 A1* | 12/2011 | Frohberg .......... H01L 21/76816 257/774 |

FOREIGN PATENT DOCUMENTS

| | | |
|---|---|---|
| KR | 10-2016-0089843 | 7/2016 |
| KR | 10-1683405 | 12/2016 |

\* cited by examiner

SEMICONDUCTOR DEVICE INCLUDING A PASSIVATION SPACER AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2017-0136295, filed on Oct. 20, 2017, in the Korean Intellectual Property Office, the disclosure of which is incorporated by reference herein in its entirety.

TECHNICAL FIELD

Exemplary embodiments of the present inventive concept relate to a semiconductor device, and more particularly to a semiconductor device including a passivation spacer and a method of fabricating the same.

DISCUSSION OF RELATED ART

Semiconductor devices may be relatively small, multi-functional and relatively inexpensive. Semiconductor devices may be classified into a memory device for storing data, a logic device for processing data, and a hybrid device including both of memory and logic elements.

Semiconductor devices may demonstrate relatively fast speed and/or relatively low power consumption. For example, semiconductor devices may have a relatively low operating voltage. Semiconductor devices may have relatively high integration density (e.g., a relatively large number of elements per area). However, an increase in the integration density may lead to a reduction in the reliability of the semiconductor device.

SUMMARY

An exemplary embodiment of the present inventive concept provides a method of fabricating a relatively highly-reliable semiconductor device.

An exemplary embodiment of the present inventive concept provides a relatively highly-reliable semiconductor device.

According to an exemplary embodiment of the present inventive concept, a method of fabricating a semiconductor device includes providing a substrate, and forming an interlayered insulating layer on the substrate. The method includes forming a preliminary via hole in the interlayered insulating layer. The method includes forming a passivation spacer on an inner side surface of the preliminary via hole. The method includes forming a via hole using the passivation spacer as an etch mask. The method includes forming a conductive via in the via hole. The passivation spacer includes an insulating material different from an insulating material included in the interlayered insulating layer.

According to an exemplary embodiment of the present inventive concept, a semiconductor device includes a substrate, and a first conductive line provided in the substrate. An interlayered insulating layer is provided on the substrate. A conductive via is provided to penetrate a lower portion of the interlayered insulating layer. The conductive via is electrically connected to the first conductive line. A first passivation spacer is disposed between the interlayered insulating layer and the conductive via. The first passivation spacer includes an insulating material different from an insulating material included in the interlayered insulating layer.

According to an exemplary embodiment of the present inventive concept, a method of fabricating a semiconductor device includes providing a substrate including a first conductive line positioned below an upper surface of the substrate. The method includes forming an etch stop layer on the substrate and forming an interlayered insulating layer on the etch stop layer. The method includes forming a via hole in the interlayered insulating layer and the etch stop layer. The via hole exposes an upper surface of the first conductive line. The method includes forming a passivation spacer on an inner side surface of the via hole. The method includes forming a conductive via connected with the first conductive line in the via hole. The passivation spacer includes an insulating material different from an insulating material included in the interlayered insulating layer.

BRIEF DESCRIPTION OF THE DRAWINGS

The above and other features of the inventive concept will become more apparent by describing in detail exemplary embodiments thereof, with reference to the accompanying drawings, in which.

DETAILED DESCRIPTION

FIGS. 1 to 9 are cross-sectional views illustrating a method of fabricating a semiconductor device, according to an exemplary embodiment of the present inventive concept.

Figure 1:
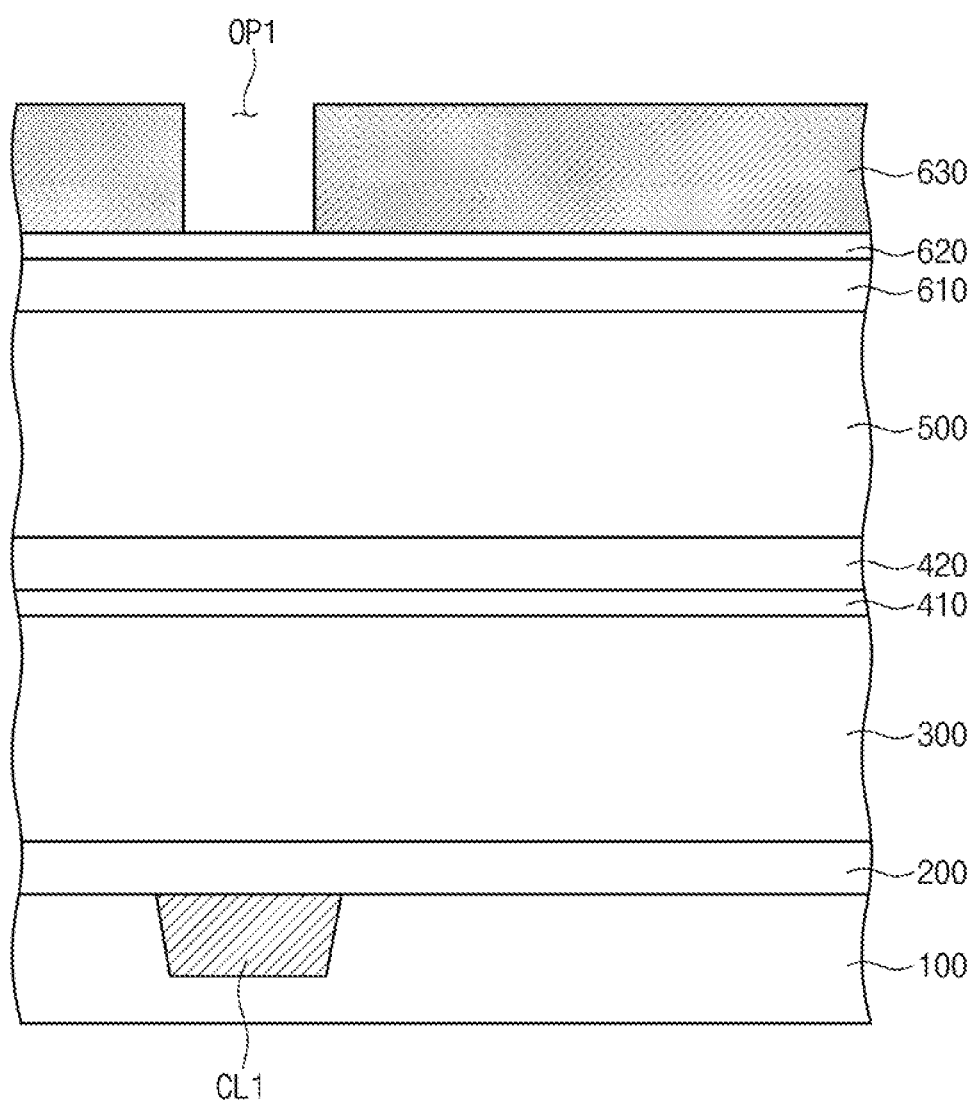
FIGS. 1 to 9 are cross-sectional views illustrating a method of fabricating a semiconductor device, according to an exemplary embodiment of the present inventive concept.

Referring to FIG. 1, a substrate 100 may be provided. The substrate 100 may include at least one of semiconductor materials (e.g., silicon (Si), germanium (Ge), or any combination thereof), conductive materials (e.g., doped polysilicon, metal silicides, metals, metal nitrides, or any combination thereof), or insulating materials (e.g., high-density plasma (HDP) oxide, tetraethyl orthosilicate (TEOS), plasma-enhanced tetraethyl orthosilicate (PE-TEOS), $O_3$-tetraethyl orthosilicate ($O_3$-TEOS), undoped silicate glass (USG), phosphosilicate glass (PSG), borosilicate glass (BSG), borophosphosilicate glass (BPSG), fluoride silicate glass (FSG), spin on glass (SOG), Tonen SilaZene (TOSZ), or any combination thereof). The substrate 100 may have a single-layered structure or a multilayered structure including a plurality of stacked layers. The substrate 100 may include, for example, electric/electronic devices (e.g., transistors).

A first conductive line CL1 may be provided in the substrate 100. The first conductive line CL1 may be electrically connected to electric/electronic devices provided in the substrate 100. The first conductive line CL1 may extend in a direction that is substantially parallel to a top surface of the substrate 100. The first conductive line CL1 may be formed of or include at least one of doped polysilicon, metal silicides, metals, metal nitrides, or any combination thereof. For example, the first conductive line CL1 may be formed of or include copper (Cu). As an example, the first conductive line CL1 may be disposed below the top surface of the substrate 100. For example, an upper surface of the first conductive line CL1 may be substantially coplanar with the upper surface of the substrate 100. A bottom surface of the first conductive line CL1 may be positioned above a bottom surface of the substrate. Thus, side and bottom surfaces of the first conductive line CL1 may be covered by the substrate 100, and the first conductive line CL1 may be positioned in a groove formed in the substrate 100.

A second etch stop layer 200, an interlayered insulating layer 300, a first etch stop layer 410, a second mask layer 420, a first sacrificial layer 500, a first mask layer 610, a first anti-reflection layer 620, and a first photoresist pattern 630 may be sequentially formed on the substrate 100. Each (e.g., any one of) or all of the second etch stop layer 200, the interlayered insulating layer 300, the first etch stop layer 410, the second mask layer 420, the first sacrificial layer 500, the first mask layer 610, and the first anti-reflection layer 620 may be formed by a chemical vapor deposition (CVD) process, a physical vapor deposition (PVD) process, or an atomic layer deposition (ALD) process.

The formation of the first photoresist pattern 630 may include coating the first anti-reflection layer 620 with a resist material to form a first photoresist layer and performing an exposure process and a development process on the first photoresist layer. For example, the exposure process may be performed using krypton fluoride (KrF) laser, argon fluoride (ArF) laser, fluorine (F2) laser, or extreme ultraviolet (EUV) light. The first photoresist pattern 630 may include a first opening OP1. The first opening OP1 may penetrate the entire first photoresist pattern 630 along a direction orthogonal to an upper surface of the substrate 100. The first photoresist pattern 630 may vertically overlap the first conductive line CL1 (e.g., along the direction orthogonal to the upper surface of the substrate 100). The first opening OP1 may define a shape (e.g., a planar or cylindrical shape) and a position of a preliminary via hole, which may be formed in the interlayered insulating layer 300 (e.g., through a subsequent process). The first opening OP1 may be formed to expose a top surface of the first anti-reflection layer 620.

The first anti-reflection layer 620 may be configured to absorb light, which is used for the exposure process on the first photoresist layer, thus preventing unintended optical reflection. For example, the first anti-reflection layer 620 may be used to prevent or suppress an undesired portion of the first photoresist layer from being irradiated with light. Thus, the first photoresist pattern 630 may be formed to have a predetermined thickness (e.g., along the direction orthogonal to the upper surface of the substrate 100). The first anti-reflection layer 620 may be formed of or may include an organic compound or an inorganic compound. For example, the first anti-reflection layer 620 may include or be formed of an organic material having an etching property similar to that of the first photoresist layer.

The first mask layer 610 may be formed of or include a material having an etch selectivity with respect to the first photoresist pattern 630 and the first anti-reflection layer 620. For example, the first mask layer 610 may include SiON, $SiO_2$, $Si_3N_4$, SiCN, polysilicon, or any combination thereof.

The first sacrificial layer 500 may be formed of or include a material having an etch selectivity with respect to the first mask layer 610. The first sacrificial layer 500 may be formed of or include a carbon-based material (e.g., having a carbon content ranging from about 80 wt % to about 99 wt %). For example, the first sacrificial layer 500 may include an amorphous carbon layer (ACL) or a spin-on-hardmask (SOH) layer.

The second mask layer 420 may be formed of or include a material having an etch selectivity with respect to the first sacrificial layer 500. For example, the second mask layer 420 may include tetraethyl orthosilicate (TEOS).

The first etch stop layer 410 may be used as an etch stop layer in a process of etching the second mask layer 420. For example, if at least one of materials that are included (e.g., uniquely included) in the first etch stop layer 410 is detected, the process of etching the second mask layer 420 may be terminated. For example, the first etch stop layer 410 may include silicon nitride (e.g., SiN), and in this case, the material may be one of SiN or a material including nitrogen (N).

The interlayered insulating layer 300 may include an insulating layer including carbon. For example, the interlayered insulating layer 300 may include SiCOH. The interlayered insulating layer 300 may include a material having an etch selectivity with respect to the second mask layer 420. For example, the interlayered insulating layer 300 and the second mask layer 420 may have an etch rate ratio of about 3:1.

The second etch stop layer 200 may be used as a reference layer for determining a termination point in a process of etching the interlayered insulating layer 300. The second etch stop layer 200 may include, for example, SiON, $SiO_2$, SiN, or SiCN.

Figure 2:
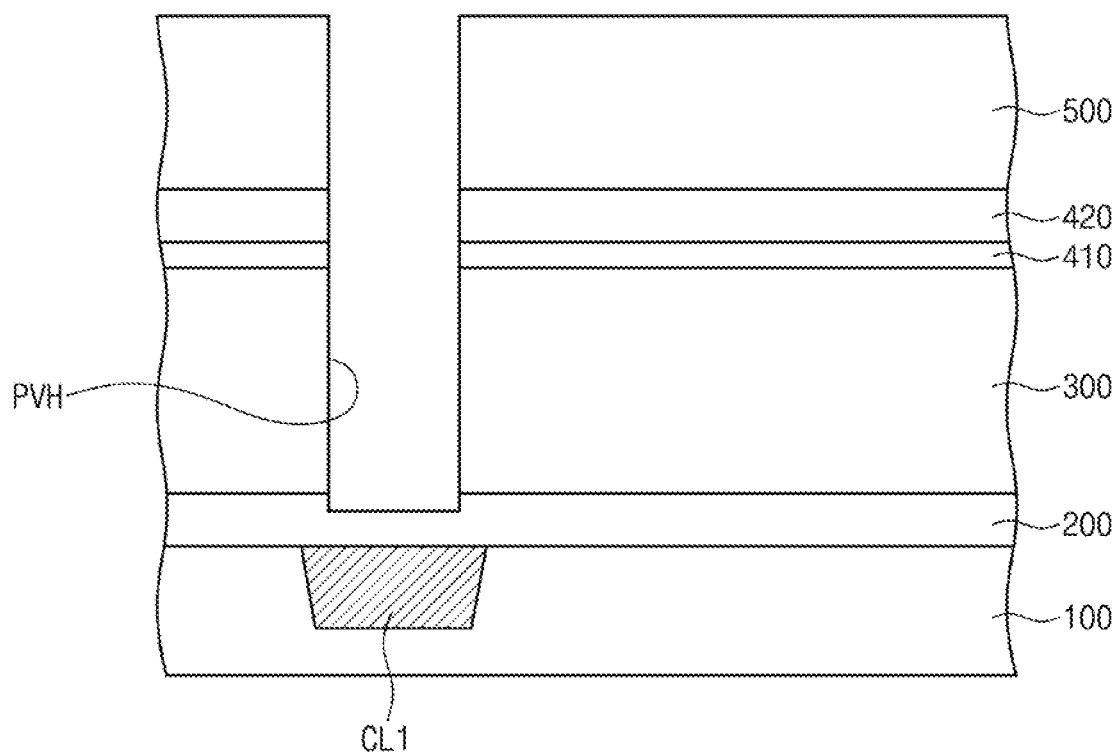

Referring to FIG. 2, an anisotropic etching process, in which the first photoresist pattern 630 is used as an etch mask, may be performed to etch the first anti-reflection layer 620, the first mask layer 610, the first sacrificial layer 500, the second mask layer 420, the first etch stop layer 410, and the interlayered insulating layer 300. The anisotropic etching process may be performed to expose the second etch stop layer 200. In an exemplary embodiment of the present inventive concept, an upper portion of the second etch stop layer 200 may be recessed by the anisotropic etching process. As a result of the anisotropic etching process, a preliminary via hole PVH may be formed in the first sacrificial layer 500, the second mask layer 420, the first etch stop layer 410, and the interlayered insulating layer 300. A bottom surface of the preliminary via hole PVH may be positioned below an upper surface of the etch stop layer 200. The anisotropic etching process may be performed to prevent the preliminary via hole PVH from completely penetrating the second etch stop layer 200. Thus, a top surface of the first conductive line CL1 might not be exposed to the preliminary via hole PVH. The second etch stop layer 200 may prevent elements in the first conductive line CL1 from migrating into the preliminary via hole PVH. After the anisotropic etching process, the first photoresist pattern 630, the first anti-reflection layer 620, and the first mask layer 610 may be removed.

Figure 3:
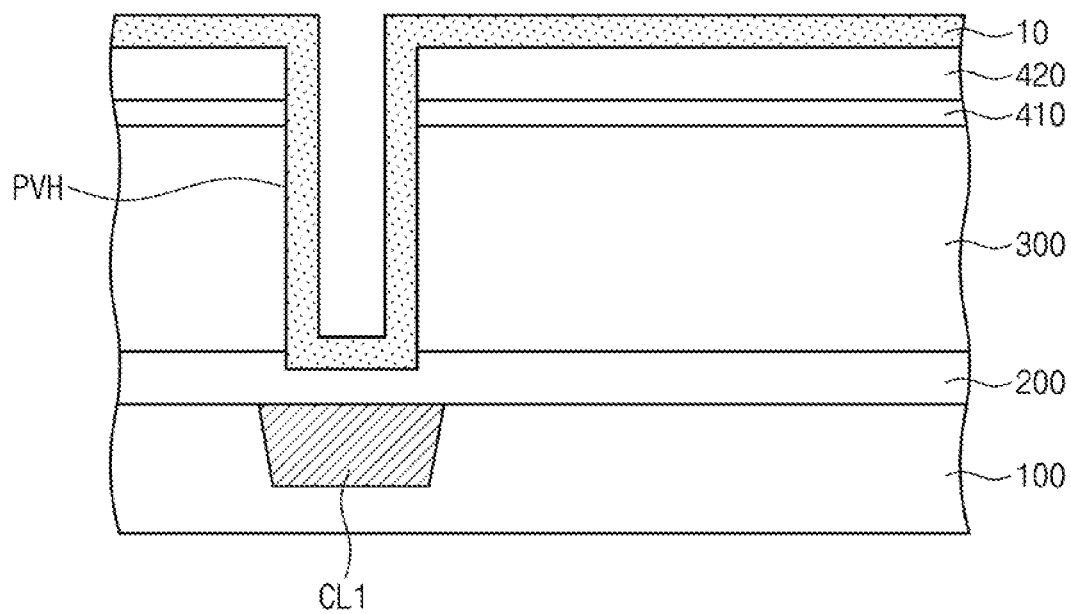

Referring to FIG. 3, the first sacrificial layer 500 may be removed. The first sacrificial layer 500 may be removed by an ashing or strip process. For example, the first sacrificial layer 500 may be removed by an ashing process using CO or $CO_2$ gas. Accordingly, a top surface of the second mask layer 420 may be exposed.

In general, the interlayered insulating layer 300 may be oxidized in an ashing process using $O_2$ gas. However, according to an exemplary embodiment of the present inventive concept, it may be possible to reduce or prevent oxidation of the interlayered insulating layer 300, because the process of removing the first sacrificial layer 500 is performed by the ashing process using the CO or $CO_2$ gas.

A passivation layer 10 may be formed to substantially cover the top surface of the second mask layer 420 and an inner surface (e.g., side and bottom surfaces) of the preliminary via hole PVH. The formation of the passivation layer 10 may include a chemical vapor deposition (CVD) process, a physical vapor deposition (PVD) process, or an atomic layer deposition (ALD) process. The passivation layer 10 may extend along the top surface of the second mask layer 420 and the inner surface of the preliminary via hole PVH. The passivation layer 10 may include an insulating material different from an insulating material included in the interlayered insulating layer 300. For example, the passivation layer 10 may include silicon oxide (e.g., $SiO_2$), silicon nitride (e.g., SiCN or SiBN), or silicon oxynitride (e.g., SiON).

Figure 4:
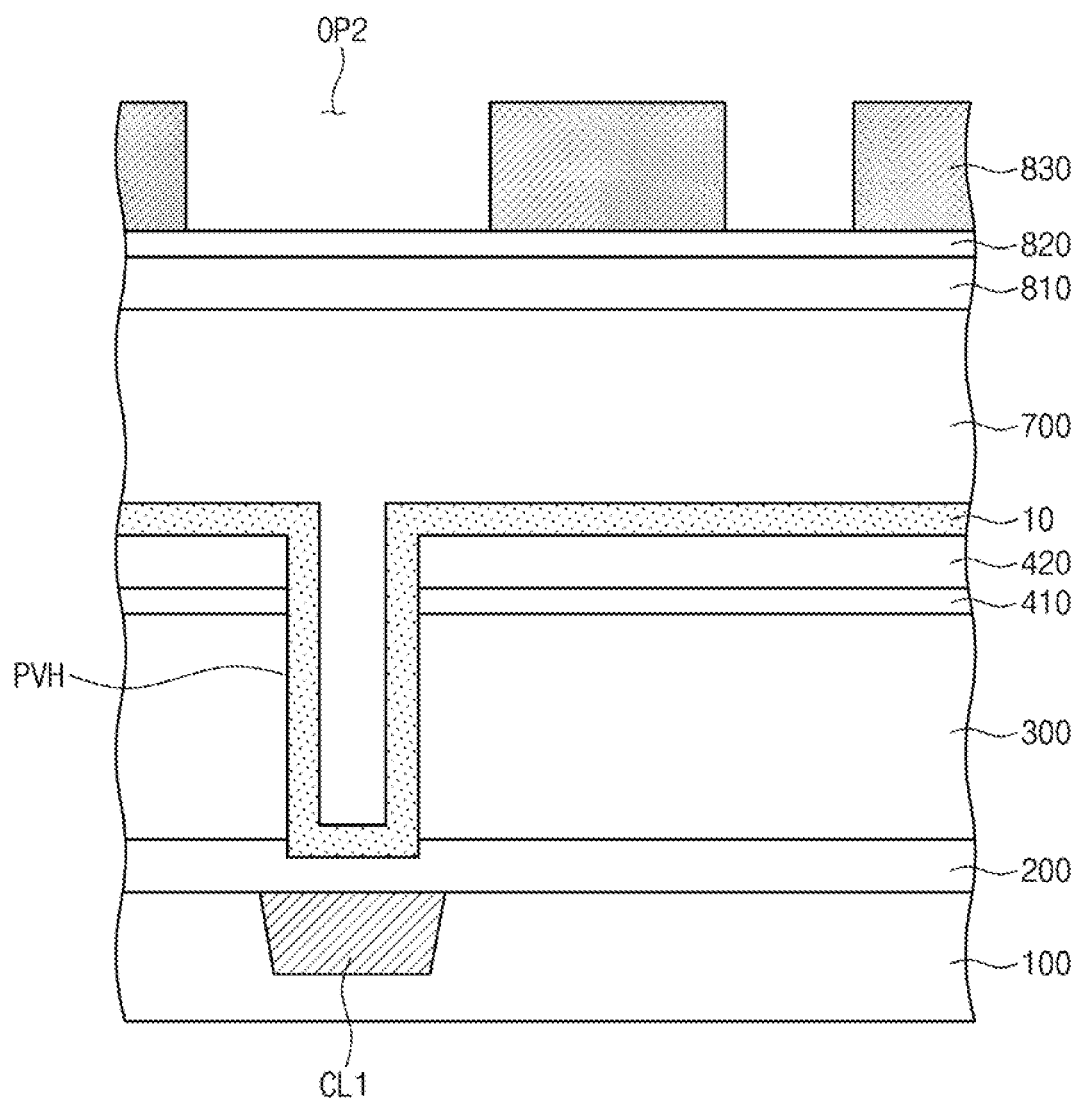

Referring to FIG. 4, a second sacrificial layer 700, a third mask layer 810, a second anti-reflection layer 820, and a second photoresist pattern 830 may be sequentially formed on the passivation layer 10. Each of the second sacrificial layer 700, the third mask layer 810, and the second anti-reflection layer 820 may be formed through a chemical vapor deposition (CVD) process, a physical vapor deposition (PVD) process, or an atomic layer deposition (ALD) process.

The formation of the second photoresist pattern 830 may include coating the second anti-reflection layer 820 with a resist material to form a second photoresist layer and then performing an exposure process and a development process on the second photoresist layer. For example, the exposure process may be performed using krypton fluoride (KrF) laser, argon fluoride (ArF) laser, fluorine ($F_2$) laser, or extreme ultraviolet (EUV) light. The second photoresist pattern 830 may include a second opening OP2, which is vertically overlapped with the first conductive line CL1 (e.g., along the direction orthogonal to the upper surface of the substrate 100). The second opening OP2 may have a planar shape (e.g., a cylindrical shape). A position of a trench, which will be formed in the interlayered insulating layer 300 (e.g., through a subsequent process) may be defined by the second opening OP2. The second opening OP2 may be formed to expose a top surface of the second anti-reflection layer 820. The second opening OP2 may be formed to have a width larger than that of the first opening OP1 (e.g., along the direction parallel to the top surface of the substrate 100). The width of each of the openings may refer to a distance between two opposite side surfaces of a corresponding photoresist pattern exposed by the opening, in the direction parallel to the top surface of the substrate 100.

The second anti-reflection layer 820 may be configured to absorb light, which is used for the exposure process on the second photoresist layer, thus preventing unintended optical reflection. For example, the second anti-reflection layer 820 may be used to prevent or suppress an undesired portion of the second photoresist layer from being irradiated with light. Thus, the second photoresist pattern 830 may be formed to have a predetermined width. The second anti-reflection layer 820 may be formed of or include an organic compound or an inorganic compound. For example, the second anti-reflection layer 820 may be formed of an organic material having an etching property similar to that of the second photoresist layer.

The third mask layer 810 may include a material having an etch selectivity with respect to the second photoresist pattern 830 and the second anti-reflection layer 820. For example, the third mask layer 810 may include SiON, $SiO_2$, $Si_3N_4$, SiCN, polysilicon, or any combination thereof.

The second sacrificial layer 700 may include a material having an etch selectivity with respect to the third mask layer 810. The second sacrificial layer 700 may be formed of or include a carbon-based material (e.g., having a carbon content ranging from about 80 wt % to about 99 wt %). For example, the second sacrificial layer 700 may include an amorphous carbon layer (ACL) or an SOH layer.

Figure 5:
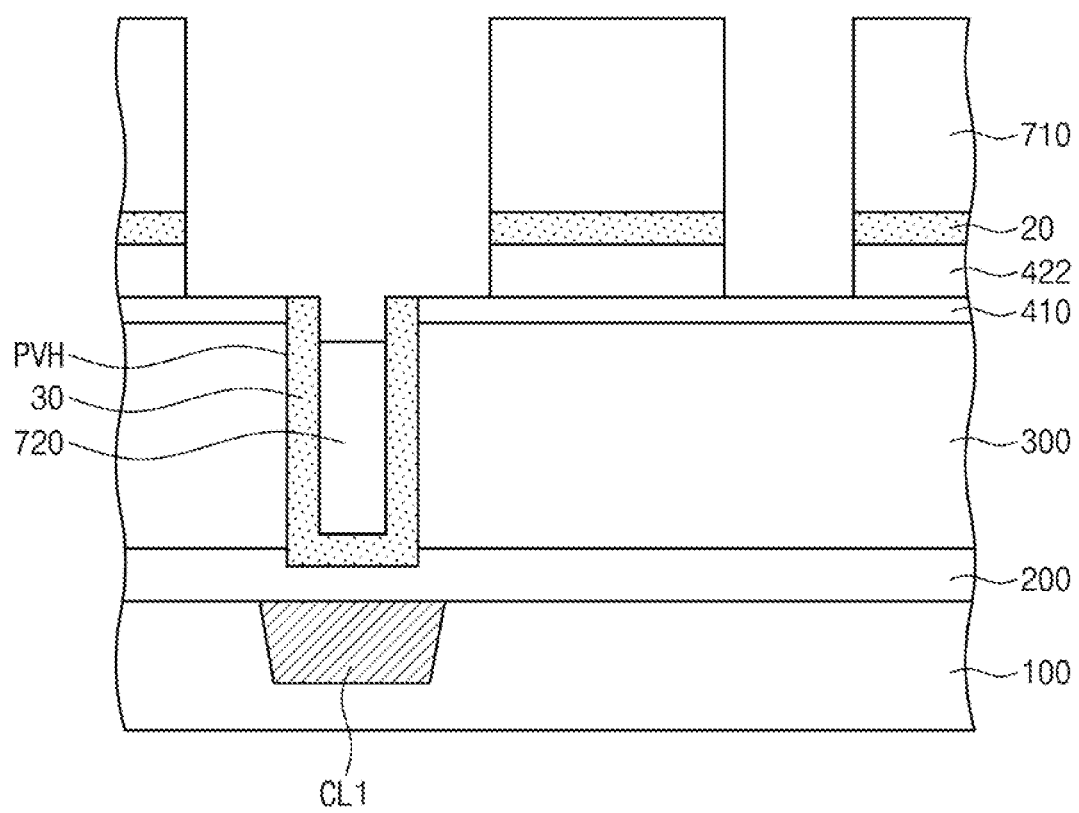

Referring to FIG. 5, an anisotropic etching process, in which the second photoresist pattern 830 is used as an etch mask, may be performed to etch the second anti-reflection layer 820, the third mask layer 810, the second sacrificial layer 700, the passivation layer 10, and the second mask layer 420. The anisotropic etching process may be performed to expose at least a portion of a top surface of the first etch stop layer 410. As a result, a second mask pattern 422, a first passivation pattern 20, and a second sacrificial pattern 710, which are sequentially stacked, may be formed on the first etch stop layer 410. After the anisotropic etching process, the second photoresist pattern 830, the second anti-reflection layer 820, and the third mask layer 810 may be removed.

As a result of the anisotropic etching process, a second passivation pattern 30 and a remaining sacrificial pattern 720 may be formed in the preliminary via hole PVH. The second passivation pattern 30 may extend along the inner surface of the preliminary via hole PVH. The second passivation pattern 30 may be disposed on side surfaces and a bottom surface of the preliminary via hole PVH. The second passivation pattern 30 may be formed to cover a surface of the interlayered insulating layer 300 exposed by the preliminary via hole PVH. The remaining sacrificial pattern 720 may at least partially fill an empty space defined by inner surfaces of the second passivation pattern 30 in the preliminary via hole PVH. A top surface of the remaining sacrificial pattern 720 may be positioned at a level lower than the top surface of the first etch stop layer 410.

Figure 6:
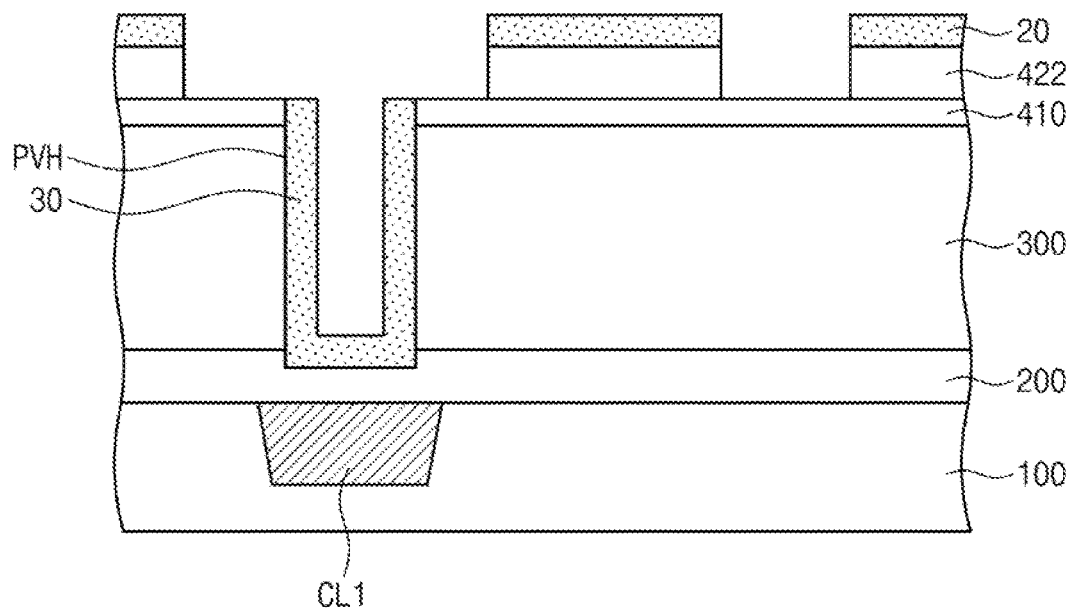

Referring to FIG. 6, the second sacrificial pattern 710 and the remaining sacrificial pattern 720 may be removed. The removal of the second sacrificial pattern 710 and the remaining sacrificial pattern 720 may include an ashing or strip process. For example, the second sacrificial pattern 710 and the remaining sacrificial pattern 720 may be removed by an ashing process using O2 gas.

In general, in the case where an ashing process using an O2 gas is performed on the interlayered insulating layer, the interlayered insulating layer may be oxidized. If the interlayered insulating layer is oxidized, permittivity of the interlayered insulating layer may be increased. The interlayered insulating layer (e.g., an inter-metal insulating layer) may be used to electrically separate conductive patterns (e.g., metal patterns) that are spaced apart from each other with the interlayered insulating layer disposed therebetween, and in this case, a process may be performed to reduce permittivity of the interlayered insulating layer. As an example, in the case where the permittivity of the interlayered insulating layer is increased, accuracy in achieving desired technical characteristics for the permittivity of the interlayered insulating layer may be reduced. Furthermore, to prevent the interlayered insulating layer from being oxidized, CO or $CO_2$ gas may be used for an ashing process. In this case, it may, however, be difficult to completely remove a remaining portion of the sacrificial pattern, when compared with the ashing process using the $O_2$ gas.

According to an exemplary embodiment of the present inventive concept, the second passivation pattern 30 may be provided to cover an inner surface of the interlayered insulating layer 300 (e.g., inner and bottom surfaces of the interlayered insulating layer 300) exposed by the preliminary via hole PVH, and the first etch stop layer 410 may be provided to cover a top surface of the interlayered insulating layer 300. Accordingly, the interlayered insulating layer 300 does not come into contact with the $O_2$ gas, during the ashing process for removing the remaining sacrificial pattern 720. Thus, the interlayered insulating layer 300 is not oxidized by the ashing process, in which $O_2$ gas is used. As a result, it may be possible to prevent the interlayered insulating layer 300 from being oxidized during a process of completely removing the remaining sacrificial pattern 720.

Figure 7:
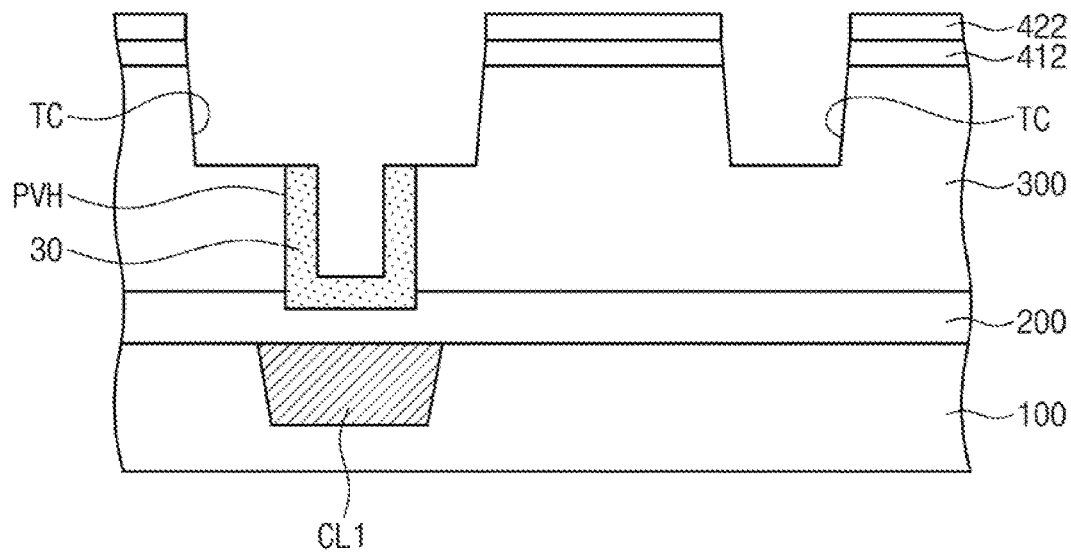

Referring to FIG. 7, an anisotropic etching process, in which the first passivation pattern 20 and the second mask pattern 422 are used as an etch mask, may be performed to etch the first etch stop layer 410 and the interlayered insulating layer 300. Thus, a first etch stop pattern 412 and a trench TC may be formed. The trench TC may be formed in an upper portion of the interlayered insulating layer 300, and the preliminary via hole PVH may be formed in a lower portion of the interlayered insulating layer 300. The trench TC and the preliminary via hole PVH may be connected to each other. A width of the trench TC may be larger than that of the preliminary via hole PVH (e.g., in the direction parallel to the top surface of the substrate 100), but exemplary embodiments of the present inventive concept are not limited thereto. Upper portions of the second passivation pattern 30 and the interlayered insulating layer 300 may be removed during the anisotropic etching process. For example, an upper inner side surface of the interlayered insulating layer 300 may be exposed, and a lower inner side surface of the interlayered insulating layer 300 may be covered with the second passivation pattern 30. For example, a remaining portion of the preliminary via hole PVH may include the second passivation pattern 30 covering side and bottom surfaces thereof. Upper surfaces of the second passivation pattern 30 may be substantially coplanar with a bottom surface of the trench TC (e.g., along the direction parallel to the top surface of the substrate 100).

Figure 8:
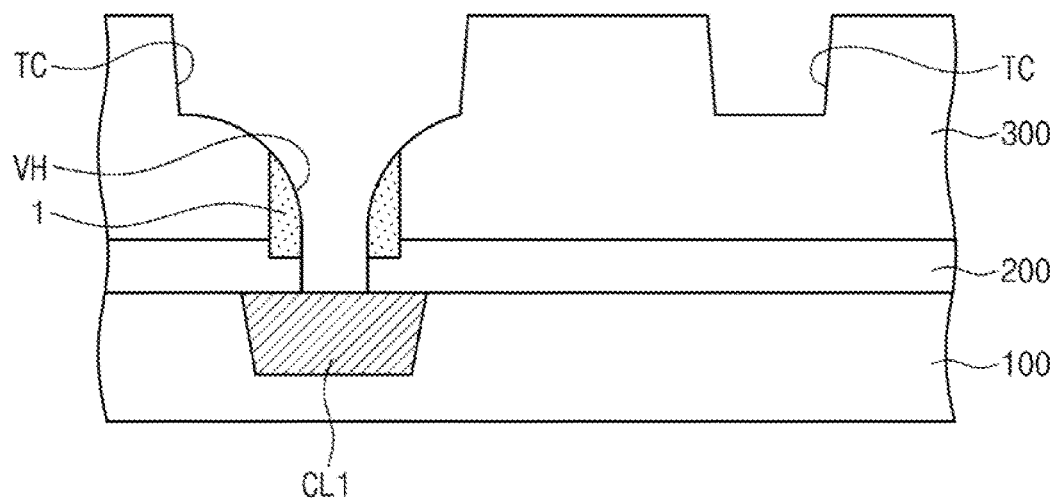

Referring to FIG. 8, an anisotropic etching process may be performed on the second mask pattern 422, the first etch stop pattern 412, the interlayered insulating layer 300, and the second passivation pattern 30 to form a via hole VH in the interlayered insulating layer 300 and the second etch stop layer 200. The via hole VH may be formed to penetrate (e.g., to completely penetrate) the second etch stop layer 200 and to expose the top surface of the first conductive line CL1. The via hole VH may have a width increasing in a direction away from the substrate 100 (e.g., along the direction orthogonal to the upper surface of the substrate 100). In an exemplary embodiment of the present inventive concept, the second mask pattern 422 and the first etch stop pattern 412 may be removed by the anisotropic etching process.

The anisotropic etching process may be performed to partially remove the second passivation pattern 30 and thus to form a passivation spacer 1. The passivation spacer 1 may have a width decreasing in an upward direction (e.g., along the direction orthogonal to the upper surface of the substrate 100). The width of the passivation spacer 1 may be measured in the direction parallel to the top surface of the substrate 100 and it may be referred to as 'a horizontal width'. During the anisotropic etching process, the passivation spacer 1 may serve as an etch mask for the second etch stop layer 200. For example, the passivation spacer 1 may prevent the second etch stop layer 200 from being etched at an unintended region and/or may prevent the via hole VH from having a width in the second etch stop layer 200 that is larger than desired. Thus, the via hole VH may be formed to have a predetermined diameter. The predetermined diameter may be narrower than a width of the uppermost portion of the via hole.

Figure 9:
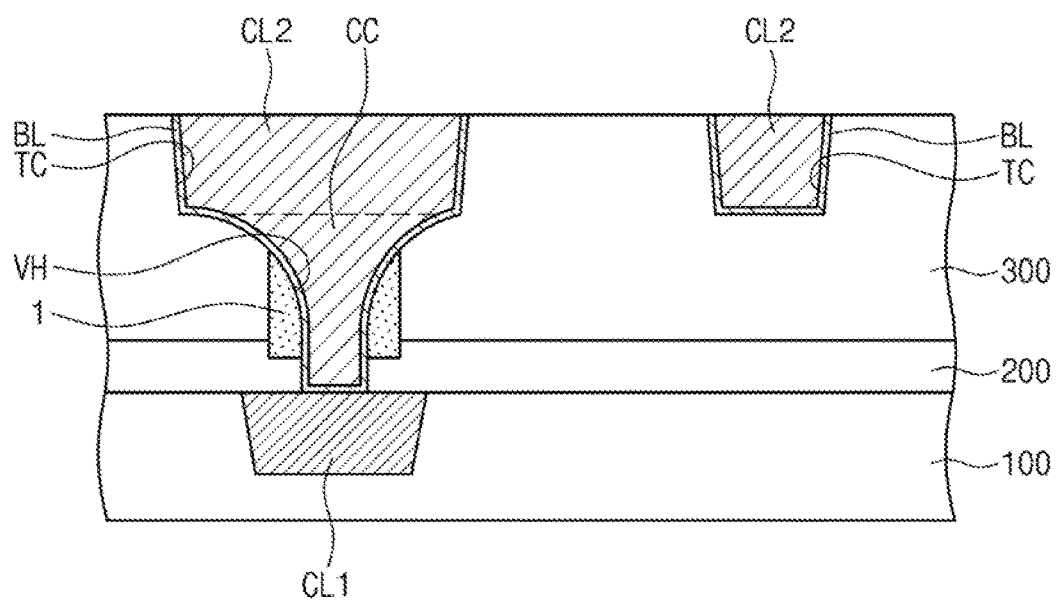

Referring to FIG. 9, a diffusion barrier layer BL may be formed on the trench TC (e.g., on side surfaces of the trench TC) and the via hole VH inner surface (e.g., on side and bottom surfaces of the via hole VH). Thus the diffusion barrier layer BL may extend along inner surfaces of the trench TC and the via hole VH. The diffusion barrier layer BL may be formed of or include, for example, titanium (Ti), titanium nitride (TiN), tantalum (Ta), tantalum nitride (TaN), or aluminum nitride (AlN), or any combination thereof.

A conductive via CC and a second conductive line CL2 may be formed on the diffusion barrier layer BL. The conductive via CC and the second conductive line CL2 may be formed by a chemical vapor deposition process (CVD), a physical vapor deposition process (PVD), or an electroplating process. For example, the formation of the conductive via CC and the second conductive line CL2 may include forming a seed layer on the diffusion barrier layer BL and performing an electroplating process on the seed layer to fill the via hole VH and the trench TC with a conductive material. For example, the conductive via CC and the second conductive line CL2 may be formed of or include at least one of metallic materials (e.g., copper (Cu) or aluminum (Al)). The second conductive line CL2 may extend in the direction parallel to the top surface of the substrate 100. The conductive via CC may extend from the second conductive line CL2 toward the first conductive line CL1.

The second passivation pattern 30 according to an exemplary embodiment of the present inventive concept may prevent an unintended oxidation of the interlayered insulating layer 300, which may occur when an ashing process is performed using an $O_2$ gas. The passivation spacer 1 may prevent the second etch stop layer 200 from being etched to a larger-than-desired width, when the via hole VH is formed. Thus, it may be possible to provide a relatively highly-reliable semiconductor device.

Referring to FIGS. 1 to 9, according to an exemplary embodiment of the present inventive concept, a method of fabricating a semiconductor device may include providing the substrate 100 including the first conductive line CL1 positioned below the upper surface of the substrate 100. The method may include forming the etch stop layer 200 on the substrate 100 and forming the interlayered insulating layer 300 on the etch stop layer 200. The method may include forming the via hole VH in the interlayered insulating layer 300 and the etch stop layer 200. The via hole VH may expose an upper surface of the first conductive line CL1. The method may include forming the passivation spacer 1 on an inner side surface of the via hole VH. The method may include forming the conductive via CC connected with the first conductive line CL1 in the via hole VH. The passivation spacer 1 may include an insulating material different from an insulating material included in the interlayered insulating layer 300.

A width of the passivation spacer 1 may narrow along a direction orthogonal to an upper surface of the substrate 100.

FIGS. 10 to 18 are cross-sectional views illustrating a method of fabricating a semiconductor device, according to an exemplary embodiment of the present inventive concept. Like reference numerals may refer to like elements throughout the specification and drawings. Thus, descriptions of components described below with reference to FIGS. 10 to 18 that are the same or substantially the same as those described above with reference to FIGS. 1 to 9 may be omitted below.

Figure 10:
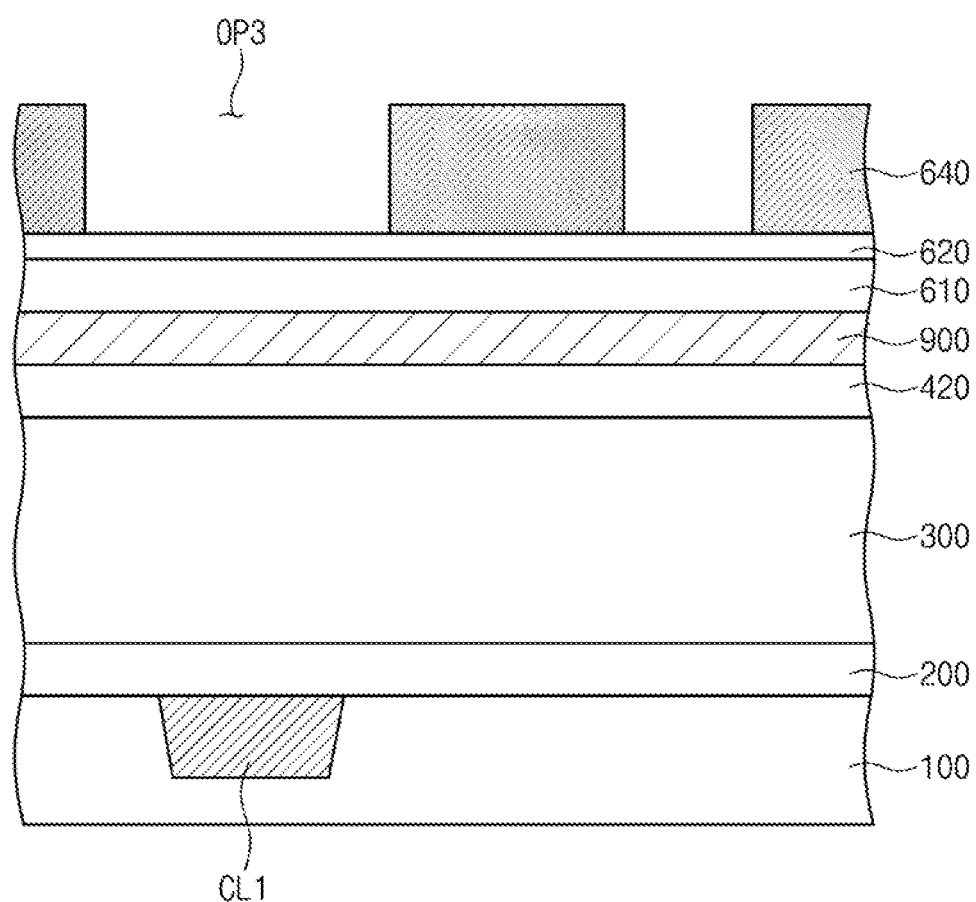
FIGS. 10 to 18 are cross-sectional views illustrating a method of fabricating a semiconductor device, according to an exemplary embodiment of the present inventive concept.

Referring to FIG. 10, the substrate 100 including the first conductive line CL1 may be provided. The substrate 100 and the first conductive line CL1 may be substantially the same as the substrate 100 including the first conductive line CL1 described above with reference to FIG. 1. The etch stop layer 200, the interlayered insulating layer 300, the second mask layer 420, a third sacrificial layer 900, the first mask layer 610, the first anti-reflection layer 620, and a third photoresist pattern 640 may be sequentially formed on the substrate 100. The etch stop layer 200, the interlayered insulating layer 300, the second mask layer 420, the third sacrificial layer 900, the first mask layer 610, and the first anti-reflection layer 620 may be formed by a chemical vapor deposition (CVD) process, a physical vapor deposition (PVD) process, or an atomic layer deposition (ALD) process. The etch stop layer 200, the interlayered insulating layer 300, the second mask layer 420, the first mask layer 610, and the first anti-reflection layer 620 may be substantially the same as the second etch stop layer 200, the interlayered insulating layer 300, the second mask layer 420, the first mask layer 610, and the first anti-reflection layer 620 described above with reference to FIG. 1.

The third photoresist pattern 640 may be formed by substantially the same process as that for the second photoresist pattern 830 described above with reference to FIG. 4. The third photoresist pattern 640 may include a third opening OP3, which is vertically overlapped with the first conductive line CL1 (e.g., along the direction orthogonal to the upper surface of the substrate 100). The third opening OP3 may define a planar shape (e.g., a cylindrical shape) and a position of a trench, which will be formed in the interlayered insulating layer 300 (e.g., through a subsequent process). The third opening OP3 may be formed to expose a top surface of the first anti-reflection layer 620.

The third sacrificial layer 900 may include a different material from that of the second sacrificial layer 700 described in more detail below. The third sacrificial layer 900 may include a metallic material which is used as a hard mask. In an exemplary embodiment of the present inventive concept, the third sacrificial layer 900 may include titanium nitride (TiN) or titanium (Ti).

Figure 11:
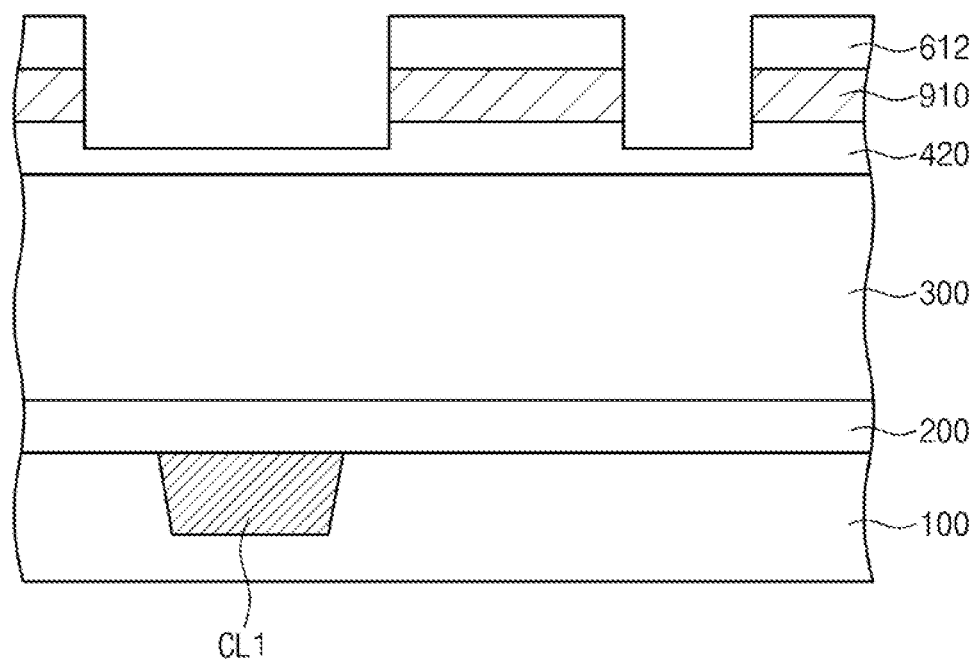

Referring to FIG. 11, an anisotropic etching process, in which the third photoresist pattern 640 is used as an etch mask, may be performed to etch the first anti-reflection layer 620, the first mask layer 610, the third sacrificial layer 900, and the second mask layer 420. The anisotropic etching process may be performed to expose the second mask layer 420. In an exemplary embodiment of the present inventive concept, an upper portion of the second mask layer 420 may be recessed by the anisotropic etching process. The first mask layer 610 and the third sacrificial layer 900 may be etched by the anisotropic etching process, thus forming a first mask pattern 612 and a third sacrificial pattern 910.

After the anisotropic etching process, the third photoresist pattern 640 and the first anti-reflection layer 620 may be removed.

Figure 12:
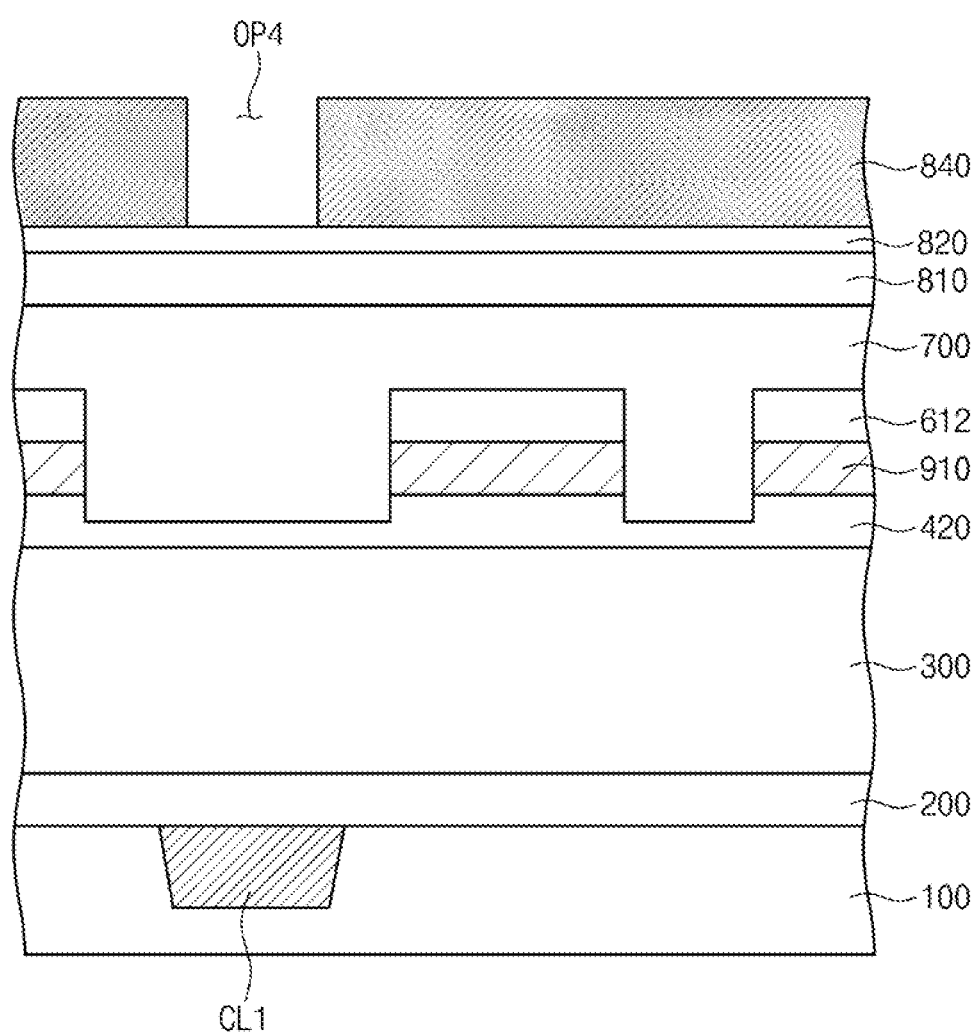

Referring to FIG. 12, the second sacrificial layer 700, the third mask layer 810, the second anti-reflection layer 820, and a fourth photoresist pattern 840 may be sequentially formed on the second mask layer 420 to cover the first mask pattern 612 and the third sacrificial pattern 910. Each of the second sacrificial layer 700, the third mask layer 810, and the second anti-reflection layer 820 may be formed by a chemical vapor deposition (CVD) process, a physical vapor deposition (PVD) process, or an atomic layer deposition (ALD) process. The second sacrificial layer 700, the third mask layer 810, and the second anti-reflection layer 820 may be substantially the same as the second sacrificial layer 700, the third mask layer 810, and the second anti-reflection layer 820 described above with reference to FIG. 4.

The fourth photoresist pattern 840 may be formed by substantially the same process as that for the first photoresist pattern 630 described in more detail above with reference to FIG. 1. The fourth photoresist pattern 840 may include a fourth opening OP4, which is vertically overlapped with the first conductive line CL (e.g., along the direction orthogonal to the upper surface of the substrate 100). The fourth opening OP4 may define a planar shape (e.g., a cylindrical shape) and a position of a preliminary via hole PVH, which will be formed in the interlayered insulating layer 300 (e.g., through a subsequent process). The fourth opening OP4 may be formed to expose the top surface of the second anti-reflection layer 820. A width of the fourth opening OP4 may be less than that of the third opening OP3.

Figure 13:
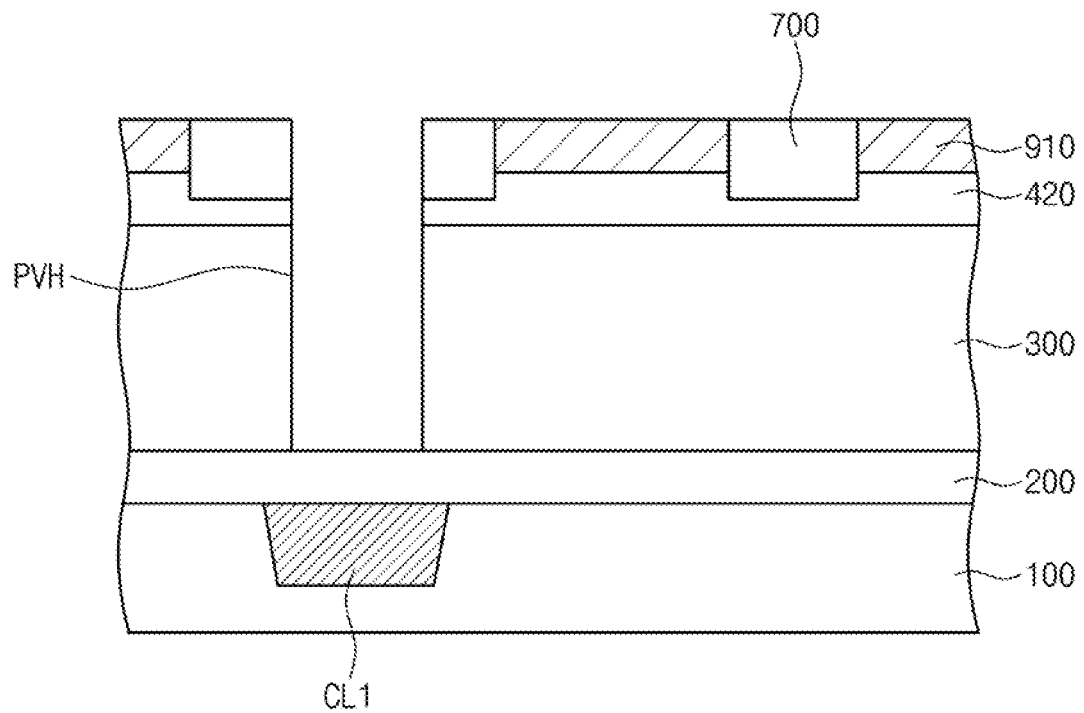

Referring to FIG. 13, an anisotropic etching process, in which the fourth photoresist pattern 840 is used as an etch mask, may be performed to etch the second anti-reflection layer 820, the third mask layer 810, the second sacrificial layer 700, the second mask layer 420, and the interlayered insulating layer 300. Thus, the preliminary via hole PVH may be formed in the second sacrificial layer 700, the second mask layer 420, and the interlayered insulating layer 300. The preliminary via hole PVH may be formed to expose a top surface of the etch stop layer 200.

After the anisotropic etching process, the fourth photoresist pattern 840, the second anti-reflection layer 820, the third mask layer 810, and the first mask pattern 612 may be removed.

Figure 14:
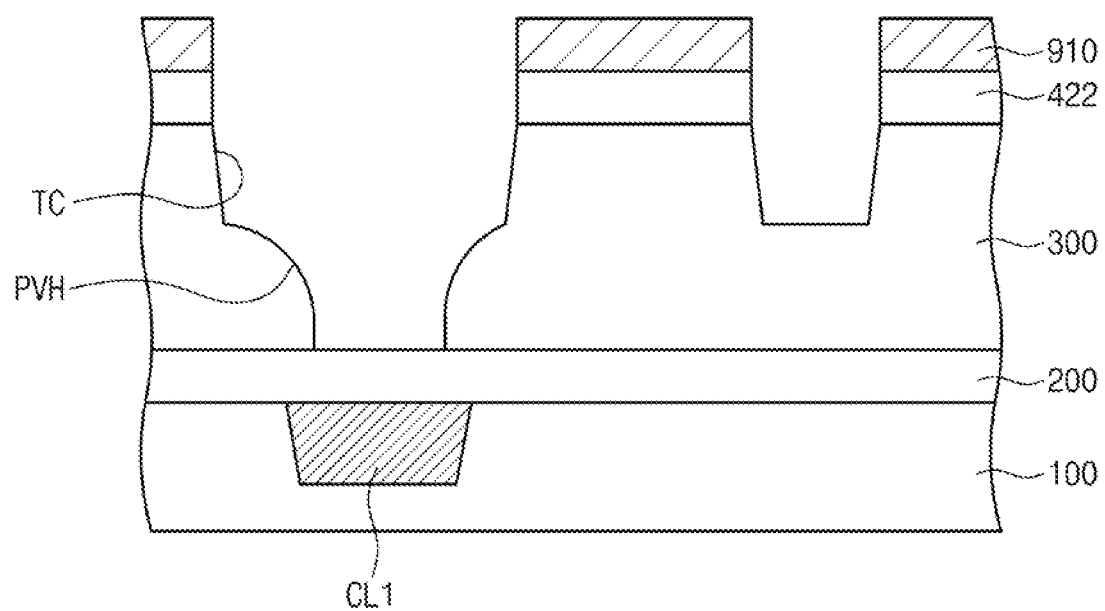

Referring to FIG. 14, the second sacrificial layer 700 may be removed. The removal of the second sacrificial layer 700 may include an ashing process or a strip process. For example, the second sacrificial layer 700 may be removed by an ashing process using CO or $CO_2$ gas. As a result, the second mask layer 420 and the third sacrificial pattern 910 may be exposed.

An anisotropic etching process, in which the third sacrificial pattern 910 is used as an etch mask, may be performed to expand the preliminary via hole PVH and to form the trench TC. For example, the expanded preliminary via hole PVH may be formed in a lower portion of the interlayered insulating layer 300, and the trench TC may be formed in an upper portion of the interlayered insulating layer 300. The preliminary via hole PVH and the trench TC may be connected to each other. The preliminary via hole PVH may be formed to have a diameter increasing in an upward direction. Thus, a width of the preliminary via hole PVH may continually increase moving away from the substrate 100 along the direction orthogonal to the upper surface of the substrate 100. The second mask layer 420 may be etched by the anisotropic etching process, thus forming the second mask pattern 422.

Figure 15:
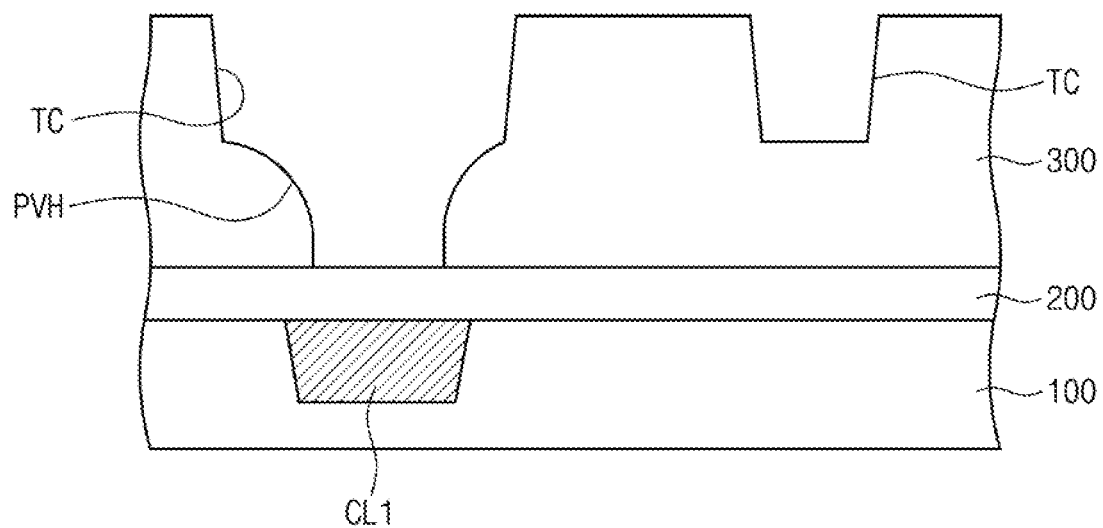

Referring to FIG. 15, the third sacrificial pattern 910 and the second mask pattern 422 may be removed, after the anisotropic etching process described with reference to FIG. 14. For example, the third sacrificial pattern 910 and the second mask pattern 422 may be removed by a wet etching process. Accordingly, the top surface of the interlayered insulating layer 300 may be exposed.

Figure 16:
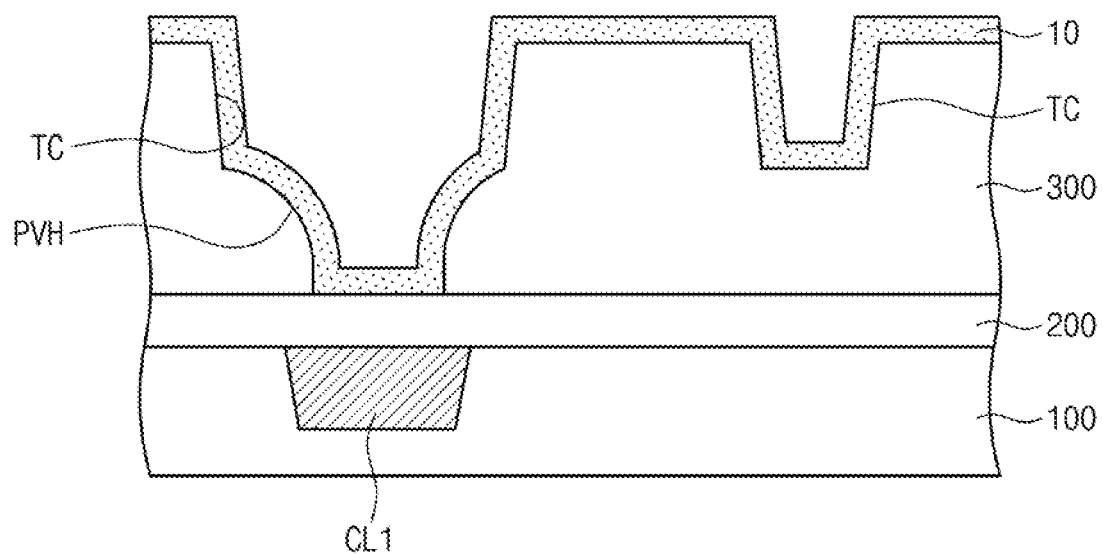

Referring to FIG. 16, the passivation layer 10 may be formed on the top surface of the interlayered insulating layer 300, the inner surface of the trench TC, and the inner surface of the preliminary via hole PVH. The passivation layer 10 may be formed to conformally cover the top surface of the interlayered insulating layer 300, the inner surface of the trench TC, and the inner surface of the preliminary via hole PVH. The configuration of the passivation layer 10 may be substantially the same as the passivation layer 10 described with reference to FIG. 3, for example.

Figure 17:
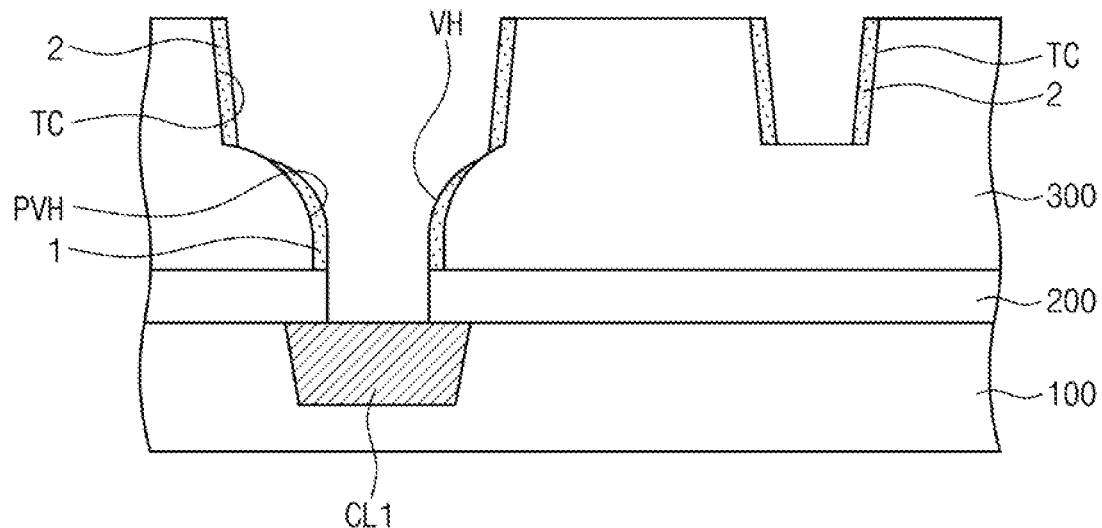

Referring to FIG. 17, a large-area anisotropic etching process may be performed to etch the passivation layer 10. As a result, a first passivation spacer 1 may be formed on an inner side surface of the preliminary via hole PVH, and a second passivation spacer 2 may be formed on an inner side surface of the trench TC (e.g., above the first passivation spacer 1). The first passivation spacer 1 may have a width decreasing in an upward direction moving away from the substrate 100 (e.g., along the direction orthogonal to the upper surface of the substrate 100). The second passivation spacer 2 may be spaced apart from the first passivation spacer 1 (e.g., along the direction orthogonal to the upper surface of the substrate 100).

The via hole VH may be defined by an inner surface of the first passivation spacer 1 and an inner surface of the etch stop layer 200. During the anisotropic etching process, the first passivation spacer 1 may serve as an etch mask for the etch stop layer 200. For example, the first passivation spacer 1 may prevent the etch stop layer 200 from being etched at an unintended region or may prevent the via hole VH from having a larger-than-desired width in the etch stop layer 200. As an example, the via hole VH may be formed to have a predetermined diameter, and thus the via hole VH may have a predetermined width along the direction parallel to the top surface of the substrate 100. The via hole VH may be formed to penetrate (e.g., to completely penetrate) the etch stop layer 200 and to expose the top surface of the first conductive line CL1.

Figure 18:
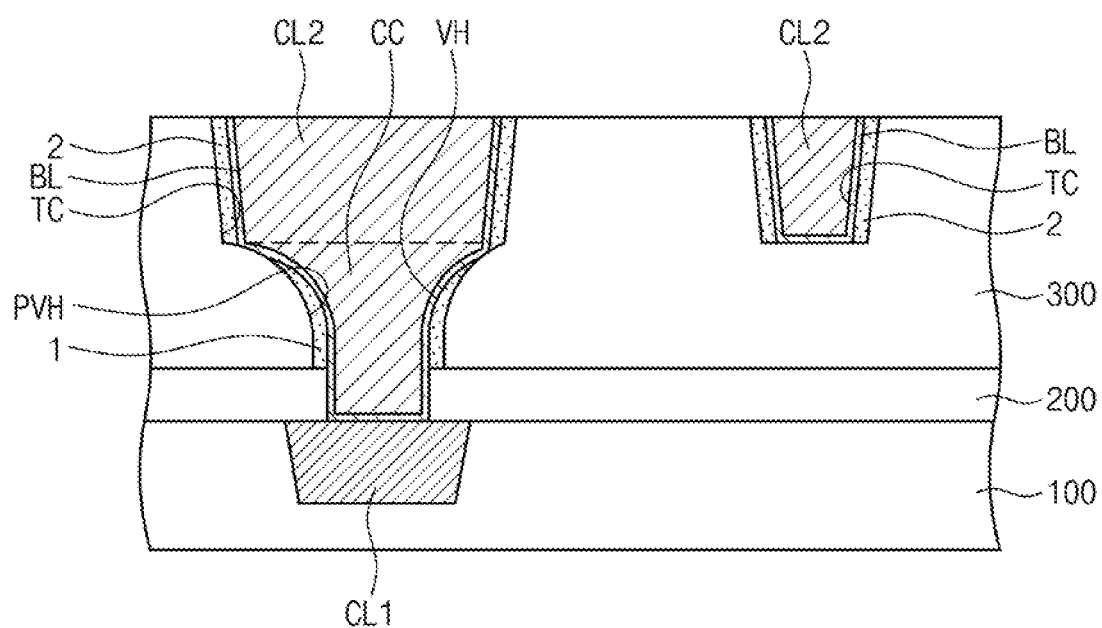

Referring to FIG. 18, the diffusion barrier layer BL may be formed on the inner surfaces of the trench TC and the via hole V. The diffusion barrier layer BL may be formed to conformally cover the inner surfaces of the trench TC and the via hole VH. For example, the diffusion barrier layer BL may be formed of or include at least one of metal nitrides (e.g., tungsten nitride). The diffusion barrier layer BL may be substantially the same as the diffusion barrier layer BL described in more detail above with reference to FIG. 9.

The conductive via CC and the second conductive line CL2 may be formed on the diffusion barrier layer BL. The conductive via CC and the second conductive line CL2 may be formed by a chemical vapor deposition process (CVD), a physical vapor deposition process (PVD), or an electroplating process. For example, the formation of the conductive via CC and the second conductive line CL2 may include forming a seed layer on the diffusion barrier layer BL and performing an electroplating process on the seed layer to fill the via hole VH and the trench TC with a conductive material. The conductive via CC and the second conductive line CL2 may be formed of or include at least one of, for example, metallic materials (e.g., copper (Cu) or aluminum (Al)). The second conductive line CL2 may extend in a direction parallel to the top surface of the substrate 100. The conductive via CC may extend from the second conductive line CL2 toward the first conductive line CL1.

According to an exemplary embodiment of the present inventive concept, the first passivation spacer 1 may prevent the etch stop layer 200 from being etched to a larger-than-desired width in a process of forming the via hole VH. Thus, it may be possible to provide a relatively highly-reliable semiconductor device.

According to an exemplary embodiment of the present inventive concept, a method of fabricating a relatively highly-reliable semiconductor device may be provided.

According to an exemplary embodiment of the present inventive concept, a relatively highly-reliable semiconductor device may be provided.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:

1. A method of fabricating a semiconductor device, comprising:
   providing a substrate;
   forming an interlayered insulating layer on the substrate;
   forming a preliminary via hole in the interlayered insulating layer;
      forming a passivation layer on a top surface of the interlayered insulating layer and an inner surface of the preliminary via hole;
      forming a second sacrificial layer on the passivation layer;
      removing the portion of the second sacrificial layer disposed in the preliminary via hole by an ashing process using $O_2$ gas, wherein the passivation layer remains on an entire surface of the preliminary via hole during the ashing process using $O_2$ gas;
   forming a passivation spacer on an inner side surface of the preliminary via hole;
   forming a via hole using the passivation spacer as an etch mask; and
   forming a conductive via in the via hole,
   wherein the passivation spacer comprises an insulating material different from an insulating material included in the interlayered insulating layer.

2. The method of claim 1, wherein the interlayered insulating layer comprises an insulating material including carbon.

3. The method of claim 2, wherein the forming of the preliminary via hole comprises:
   forming a first sacrificial layer on the interlayered insulating layer;
   performing a first anisotropic etching process, in which the first sacrificial layer is used as an etch mask, to form the preliminary via hole penetrating the interlayered insulating layer; and
   removing the first sacrificial layer,
   wherein the first sacrificial layer comprises an amorphous carbon layer (ACL) or a spin-on-hardmask (SOH).

4. The method of claim 3, further comprising:
   sequentially forming the second sacrificial layer and a first k layer on the passivation layer;
   performing a second anisotropic etching process, in which the first mask layer is used as an etch mask, to form a second sacrificial pattern on the interlayered insulating layer and a remaining sacrificial pattern in the preliminary via hole, and to form a passivation pattern in the preliminary via hole from the passivation layer; and
   removing the second sacrificial pattern and the remaining sacrificial pattern by an ashing process using $O_2$ gas.

5. The method of claim 4, wherein the passivation pattern is used during the ashing process to prevent the interlayered insulating layer from being exposed to the $O_2$ gas during the ashing process.

6. The method of claim 4, further comprising sequentially forming a first etch stop layer and a second mask layer between the top surface of the interlayered insulating layer and the passivation layer, before the second anisotropic etching process, wherein the second mask layer is patterned by the second anisotropic etching process to form a second mask pattern exposing a top surface of the first etch stop layer, and a top surface of the second mask pattern is exposed by the asking process.

7. The method of claim 6, wherein the second mask pattern comprises tetraethylorthosilicate (TEOS).

8. The method of claim 6, further comprising performing a third anisotropic etching process, in which the second mask pattern is used as an etch mask, to form a trench in an upper portion of the interlayered insulating layer, wherein the trench is formed to expose an upper inner side surface of the interlayered insulating layer, and the trench and the preliminary via hole are connected to each other.

9. The method of claim 8, further comprising forming a second etch stop layer on the substrate, before the forming of the interlayered insulating layer, wherein the third anisotropic etching process is performed to expand the preliminary via hole, and to form the via hole penetrating the second etch stop layer and exposing a top surface of the substrate.

10. The method of claim 4, wherein the forming of the preliminary via hole further comprises:

forming a third sacrificial layer on the interlayered insulating layer;

forming a fourth sacrificial layer to cover side and top surfaces of the third sacrificial layer;

performing a fourth anisotropic etching process, in which the fourth sacrificial layer is used as an etch mask, to form the preliminary via hole in the interlayered insulating layer; and removing the fourth sacrificial layer, wherein the third sacrificial layer comprises a metal hard mask, and the fourth sacrificial layer comprises an amorphous carbon layer (ACL) or a spin-on-hardmask (SOH).

11. The method of claim 10, further comprising performing a fifth anisotropic etching process, in which the third sacrificial layer is used as an etch mask, to form a trench in an upper portion of the interlayered insulating layer, wherein the fifth anisotropic etching process is performed to expand the preliminary via hole, and the trench and the preliminary via hole are connected to each other.

12. A method of fabricating a semiconductor device, comprising:

providing a substrate, wherein the substrate includes a first conductive line positioned below an upper surface of the substrate;

forming an etch stop layer on the substrate;

forming an interlayered insulating layer on the etch stop layer, forming a via hole in the interlayered insulating layer and the etch stop layer, wherein the via hole exposes an upper surface of the first conductive line;

forming a passivation spacer on an inner side surface of the via hole; and forming a conductive via connected with the first conductive line in the via hole, wherein the passivation spacer comprises an insulating material different from an insulating material included in the interlayered insulating layer, and wherein the interlayered insulating layer comprises an insulating material including SiCOH.

13. The method of claim 12, wherein a width of the passivation spacer narrows along a direction orthogonal to an upper surface of the substrate.

14. A method of fabricating a semiconductor device, comprising:

providing a substrate;

forming an interlayered insulating layer on the substrate;

forming a preliminary via hole in the interlayered insulating layer;

forming a trench on the preliminary via hole in the interlayered insulating layer, wherein a bottom of the trench is wider than a top of the preliminary via hole;

forming a passivation spacer on an inner side surface of the preliminary via hole;

forming a via hole using the passivation spacer as an etch mask; and forming a conductive via in the via hole, wherein the passivation spacer comprises an insulating material different from an insulating material included in the interlayered insulating layer.

* * * * *